United States Patent
Aigner et al.

(10) Patent No.: US 6,734,600 B2
(45) Date of Patent: May 11, 2004

(54) COMPONENT FOR FORMING VERTICALLY STANDING WAVES OF A WAVELENGTH

(75) Inventors: Robert Aigner, München (DE); Juha Ella, Halikko (FI)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/968,574

(22) Filed: Oct. 1, 2001

(65) Prior Publication Data

US 2002/0043888 A1 Apr. 18, 2002

Related U.S. Application Data

(63) Continuation of application No. PCT/DE00/00640, filed on Mar. 1, 2000.

(30) Foreign Application Priority Data

Mar. 30, 1999 (DE) .......................................... 199 14 468

(51) Int. Cl.[7] .............................................. H01L 41/08
(52) U.S. Cl. .................................. 310/313 B; 310/313 C
(58) Field of Search ................................ 310/320, 365, 310/366, 324

(56) References Cited

U.S. PATENT DOCUMENTS

| | | | |
|---|---|---|---|
| 2,540,412 A | * 2/1951 | Adler | ........................ 310/330 |
| 3,114,849 A | 12/1963 | Poschenrieder | |
| 4,491,761 A | * 1/1985 | Grudkowski et al. | ........ 310/358 |
| 4,571,519 A | 2/1986 | Kawabata et al. | |
| 4,623,813 A | * 11/1986 | Naito et al. | ............ 177/210 FP |
| 4,870,313 A | 9/1989 | Hirama et al. | ............ 310/312 |
| 5,153,476 A | * 10/1992 | Kosinski | .................. 310/313 B |
| 5,576,590 A | * 11/1996 | Ohnishi et al. | ............ 310/359 |
| 5,675,208 A | * 10/1997 | Huang et al. | ............... 310/320 |
| 6,218,770 B1 | * 4/2001 | Ando et al. | .................. 310/330 |

FOREIGN PATENT DOCUMENTS

| | | |
|---|---|---|
| DE | 1200890 | 9/1965 |
| DE | 1766036 | 11/1972 |
| DE | 2231467 | 1/1974 |
| JP | 03 096 005 A | 4/1991 |
| JP | 04 018 806 A | 1/1992 |
| JP | 09 130 199 A | 5/1997 |

OTHER PUBLICATIONS

"High–Q Microwave Acoustic Resonators and Filters", Kenneth M. Lakin et al., IEEE Transactions on Microwave Theory and Techniques, vol. 41, No. 12, Dec. 1993, pp. 2139–2146.

"Lateral–Field–Excitation Acoustic Resonators for Monolithic Oscillators and Filters", Woo Wai Lau et al., 1996 IEEE International Frequency Control Symposium, pp. 558–562.

"Development of Miniature Filters for Wireless Applications", K.M. Lakin et al., IEEE MTT–S Digest, pp. 883–886.

* cited by examiner

Primary Examiner—Mark Budd
(74) Attorney, Agent, or Firm—Laurence A. Greenberg; Werner H. Stemer; Ralph E. Locher

(57) ABSTRACT

A component has a piezoelectric layer, which is arranged between a first lower electrode and a first upper electrode and also a second lower electrode and a second upper electrode. The first lower electrode, the first upper electrode, the second lower electrode and the second upper electrode are in each case structured, the structures of the first upper electrode and the structures of the second upper electrode, and the structures of the first lower electrode and the structures of the second lower electrode respectively engaging in one another. The component is suitable as a filter, transformer, and impedance matcher in high-frequency applications.

12 Claims, 5 Drawing Sheets

COMPONENT FOR FORMING VERTICALLY STANDING WAVES OF A WAVELENGTH

CROSS-REFERENCE TO RELATED APPLICATION

This application is a continuation of copending International Application PCT/DE00/00640, filed Mar. 1, 2000, which designated the United States.

BACKGROUND OF THE INVENTION

Field of the Invention

The invention relates to a component which is suitable for high-frequency applications.

High-frequency application technology makes use, on the one hand, of grounded signals, which are usually referred to in the pertinent technical literature as single ended, and on the other hand of differential signals, which are usually referred to in the pertinent technical literature as balanced signals, are used. Grounded signals are sensitive to fluctuations of the ground potential. By contrast, differential signals, which are preferably symmetrical to the ground potential, are insensitive to shifts of the ground potential.

In certain high-frequency applications, for example between an antenna and a first amplifier stage of a mobile communication device, grounded signals are used, subsequently filtered and converted into differential signals. Impedance matching is often additionally required.

Resonators which have a piezoelectric layer arranged between two electrodes are often used as filters for high-frequency signals (see for example K. M. Lakin et al., IEEE MTT-S International 1995, pages 883-86; K. M. Lakin et al., IEEE Trans. Microwave Theory Techn., Vol. 41, No. 12, 1993, pages 2139-46; and W. W. Lau et al., 1996 IEEE Int. Frequency Control Symp., pages 558-62). If the high-frequency signal is applied to the two electrodes, a mechanical oscillation is induced in the piezoelectric layer. For a wavelength which corresponds to twice the thickness of the piezoelectric layer, a standing wave forms. The frequency selectivity of the impedance of such a resonator can be used for the filtering of signals.

Different types of such resonators have been proposed (see K. M. Lakin et al., IEEE MTT-S International 1995, pages 883-86). On the one hand, the resonator is fastened on a support only at the edge, while the active resonator part is arranged on the surface of a membrane above a cavity. It has also been proposed to isolate the active resonator part by an air gap from a substrate, to which the resonator is fastened at the edge. Finally, it has been proposed to arrange the resonator above a series of layers which reflects the wavelength amplified by the resonator. In that case, the resonator is connected to the substrate over its full width. The series of layers has a plurality of $\lambda/4$ layers and acts as an acoustic mirror. The space requirement of these resonators is typically 200 $\mu$m×200 $\mu$m.

These resonators have two electrodes, that is to say they are one-port assemblies, often referred to in the pertinent technical literature as one-port devices.

A two-port assembly is disclosed in K. M. Lakin et al., IEEE Trans. Microwave Theory Techn., Vol. 41, No. 12, 1993, pages 2139-46, with a piezoelectric layer arranged between two electrodes on each of both sides of a substrate. A further two-port assembly of a resonator has two filters stacked one above the other on a substrate. For this purpose, on the substrate there is provided a floating electrode, on that a first piezoelectric layer, on that a grounded electrode, on that a second piezoelectric layer and on that two electrodes arranged alongside each other. That arrangement has a high insertion loss, although stacked filters as a one-port assembly have a high stop-band attenuation. Owing to the two piezoelectric layers required in the two-port assemblies, they entail increased expenditure in comparison with the one-port assemblies.

Another possibility for filtering high-frequency signals is the use of surface-acoustic-wave filters, wherein two electrodes are arranged on the surface of a substrate of piezoelectric material (quartz, lithium niobate). These electrodes are used to induce surface acoustic waves, which propagate in the surface of the substrate. Customary dimensions of surface-acoustic-wave filters are 2×3 $mm^2$.

SUMMARY OF THE INVENTION

It is accordingly an object of the invention to provide a component, which overcomes the above-mentioned disadvantages of the heretofore-known devices and methods of this general type and which is suitable for high-frequency applications and which can be implemented as a multi-port assembly with a small surface area requirement and low expenditure.

With the foregoing and other objects in view there is provided, in accordance with the invention, a component for forming vertically standing waves of a wavelength $\lambda$, comprising:

- a piezoelectric layer having a first main surface, a second main surface opposite the first main surface, and a thickness of substantially $\lambda/2$ or an integral multiple of $\lambda/2$;
- a first pair of electrodes including a first lower electrode and a first upper electrode, and a second pair of electrodes including a second lower electrode and a second upper electrode;
- the first upper electrode and the second upper electrode being formed on the first main surface of the piezoelectric layer, and the first lower electrode and the second lower electrode being formed on the second main surface of the piezoelectric layer;
- the first upper electrode, the second upper electrode, the first lower electrode, and the second lower electrode each being structured such that structures of the first upper electrode and of the second upper electrode engage in one another and structures of the first lower electrode and of the second lower electrode engage in one another.

In other words, the component has a piezoelectric layer with a first pair of electrodes and a second pair of electrodes. The first pair of electrodes has a first lower electrode and a first upper electrode. The second pair of electrodes has a second lower electrode and a second upper electrode. The first upper electrode and the second upper electrode are arranged on a first main area of the piezoelectric layer. The first lower electrode and the second lower electrode are arranged on a second main area of the piezoelectric layer, which lies opposite the first main area. The first upper electrode, the second upper electrode, the first lower electrode and the second lower electrode are in each case structured, the structures of the first upper electrode and the structures of the second upper electrode, and the structures of the first lower electrode and the structures of the second lower electrode respectively engaging in one another. In other words, structures of the first upper electrode and of the second upper electrode and of the first lower electrode and of the second lower electrode are respectively arranged alongside one another, preferably in an alternating manner.

If, for example, a high-frequency signal is applied to the first pair of electrodes, this causes a mechanical oscillation of the piezoelectric layer. The mechanical oscillation forms in the entire piezoelectric layer, including in the regions wherein the surface of the piezoelectric layer is not occupied by the respective electrode between neighboring structures of the first upper electrode or the first lower electrode. What is known as the inverse piezo effect causes this mechanical oscillation between the second lower electrode and the second upper electrode of the second pair of electrodes to generate a high-frequency signal.

The structures of the first upper electrode, of the second upper electrode, of the first lower electrode and of the second lower electrode are preferably so fine in one dimension that they have dimensions which are less than the wavelength of a mechanical oscillation which forms between the first upper electrode and the second upper electrode on the one hand and the first lower electrode and the second lower electrode on the other hand when a high-frequency signal is applied to the first pair of electrodes.

In accordance with an added feature of the invention, the structures of the first upper electrode, of the second upper electrode, of the first lower electrode and of the second lower electrode are so fine in one dimension that they have dimensions which are less than twice the spacing between the upper electrodes and the lower electrodes. This means that these dimensions are less than the wavelength of a high-frequency signal for which a standing wave forms in the layer stack and for which the resonance condition is consequently satisfied.

If the structures of the first pair of electrodes are finer than the resonant wavelength, the influence of these structures on the mechanical oscillation which forms in the entire piezoelectric layer when a high-frequency signal is applied to the first pair of electrodes is reduced. The piezoelectric layer does not "see" these structures on account of the dimensions. What is known as the inverse piezo effect causes this mechanical oscillation between the second lower electrode and the second upper electrode of the second pair of electrodes to generate a high-frequency signal.

The high-frequency signal applied to the first pair of electrodes and the high-frequency signal induced at the second pair of electrodes are electrically isolated from one another. The first lower electrode and the first upper electrode and also the second lower electrode and the second upper electrode can consequently be wired independently of one another. In particular, the component allows the conversion of a grounded signal into a differential signal. For this purpose, the first lower electrode or the first upper electrode of the first pair of electrodes is connected to ground potential, while the other electrode of the first pair of electrodes has the high-frequency signal applied to it. The second upper electrode and the second lower electrode of the second pair of electrodes on the other hand are connected symmetrically to the ground potential. In this way, the grounded input signal is converted into a differential signal at the second pair of electrodes.

The component consequently brings about a filtering of the input signal and a transformation of the input signal simultaneously. In addition, an impedance matching between different impedance levels can be performed in a system over the surface occupied by the first upper electrode and the first lower electrode or the second upper electrode and the second lower electrode. With regard to the impedance matching, it is therefore advantageous to provide the first pair of electrodes and the second pair of electrodes with areas of different sizes parallel to the piezoelectric layer. Consequently both a filtering function and also a transformation and impedance matching can be simultaneously realized when the component is used. This means a saving in space and expenditure in comparison with the known solutions, wherein a number of components, possibly complex switching networks, are required for the filtering, impedance matching and transformation.

The dimensions of the structures in one dimension are preferably less by at least a factor of 3 than twice the thickness of the dielectric layer. The smaller the dimensions of the structures are, the less the structures influence the mechanical oscillations forming or the high-frequency signal induced.

The piezoelectric layer with the first pair of electrodes and the second pair of electrodes may not only be fastened on the surface of a membrane which spans a cavity in a supporting frame but also be isolated by means of an air gap from a substrate to which it is connected and also be realized above acoustic mirror layers, which prevent propagation of the mechanical oscillation into a substrate arranged thereunder.

The thickness of the piezoelectric layer is dimensioned such that a standing wave with a wavelength $\lambda$ forms in the piezoelectric layer and the neighboring electrodes or in the piezoelectric layer, one neighboring layer, for example a mirror layer, and the electrodes during the operation of the component. The thickness of the piezoelectric layer is generally $\lambda/2$ or integral multiples thereof. If the standing wave forms in the piezoelectric layer and one neighboring layer, the thickness of the piezoelectric layer is $\lambda/4$ or uneven multiples thereof.

The piezoelectric layer preferably has at least one of the materials AlN, ZnO, PdZrTiO$_x$ (PZT) or any other thin-film piezo material. In this case, the thickness of the piezoelectric layer is between 1 $\mu$m and 3 $\mu$m. The component is consequently suitable as a filter for a frequency range of between 400 MHz and 4 GHz. In this case, the electrodes have minimum dimensions of between 5 $\mu$m and 1 $\mu$m.

According to one refinement of the invention, the first upper electrode, the first lower electrode, the second upper electrode and second lower electrode in each case have a web, adjacent to which are substructures, which are connected to the web. The first upper electrode and the second upper electrode and also the first lower electrode and the second lower electrode are arranged in relation to one another in such a way that the substructures of the first upper electrode and the substructures of the second upper electrode are arranged in an alternating manner and the substructures of the first lower electrode and the substructures of the second lower electrode are arranged in an alternating manner.

The substructures may, in particular, be designed in the form of fingers, so that the respective electrode has a comb-shaped form and the first upper electrode and the second lower electrode are arranged interdigitally.

Alternatively, they may be designed in the form of branches or trees. In this case, the substructures of the upper electrode can be distinguished from the substructures of the lower electrode, with overlapping regions existing between the substructures of the upper electrode and the substructures of the lower electrode.

For the effective suppression of lateral modes during the inducement of the mechanical oscillation, it is advantageous to make the dimensions and spacings between the substructures in the component different, the dimensions and spacings varying in each case about a mean value. In particular, it is possible to vary the form of the substructures in such a way that their contour has no right angle.

The webs of the first upper electrode and of the second upper electrode may be aligned parallel to the webs of the first lower electrode and of the second lower electrode. Alternatively, the webs of the upper electrodes are rotated with respect to the webs of the lower electrodes. This has the advantage that the influence of the structuring of the individual electrodes on the mechanical oscillations forming is further reduced.

In addition, the upper electrodes may be structured differently from the lower electrodes. This difference may relate both to the form of the structuring and to the dimensions of the structuring.

Other features which are considered as characteristic for the invention are set forth in the appended claims.

Although the invention is illustrated and described herein as embodied in a component that is suitable for high-frequency applications, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
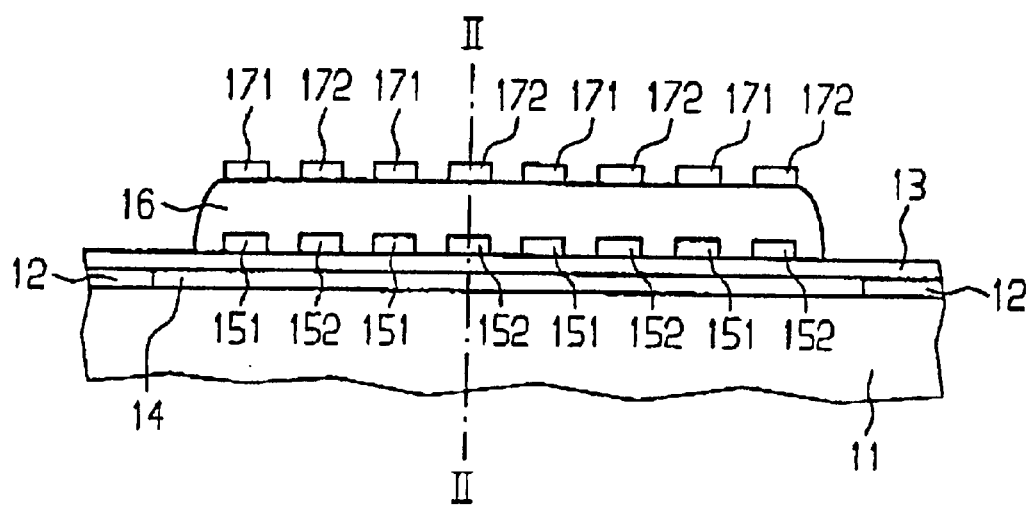
FIG. 1 shows a section through a component according to the invention, taken along the line I—I in FIG. 2.
Figure 2:
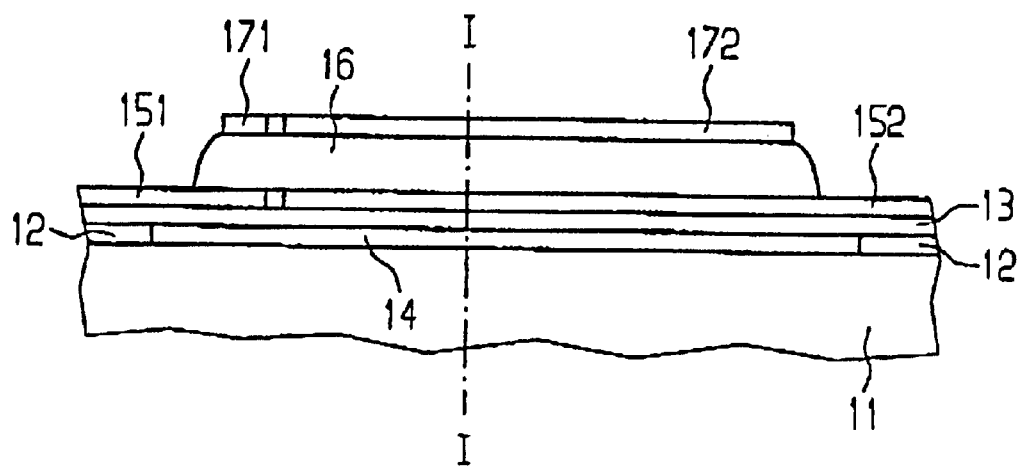
FIG. 2 is a section through the component taken along the line II—II in FIG. 1.

Referring now to the figures of the drawing in detail, which are not drawn to scale, and first, particularly, to FIGS. 1 and 2 thereof, there is shown a substrate 11 of monocrystalline silicon on which a membrane 13 of polysilicon is fastened over a supporting structure 12 of silicon oxide. Formed between the substrate 11 and the membrane 13 is a cavity 14, which has a volume of 200 $\mu$m×200 $\mu$m×1 $\mu$m. The thickness of the membrane 13 is 0.4 $\mu$m.

A first lower electrode 151 of metal, for example aluminum, and a second lower electrode 152 of metal, for example aluminum, are arranged on the surface of the membrane 13. Above the first lower electrode 151 and the second lower electrode 152 there is arranged a piezoelectric layer 16 of AlN, ZnO or $PbZrTiO_x$ (PZT) in a thickness of 2 $\mu$m. Arranged above the piezoelectric layer 16 are a first upper electrode 171 of metal, for example aluminum, and a second upper electrode 172 of metal, for example aluminum.

Figure 4:
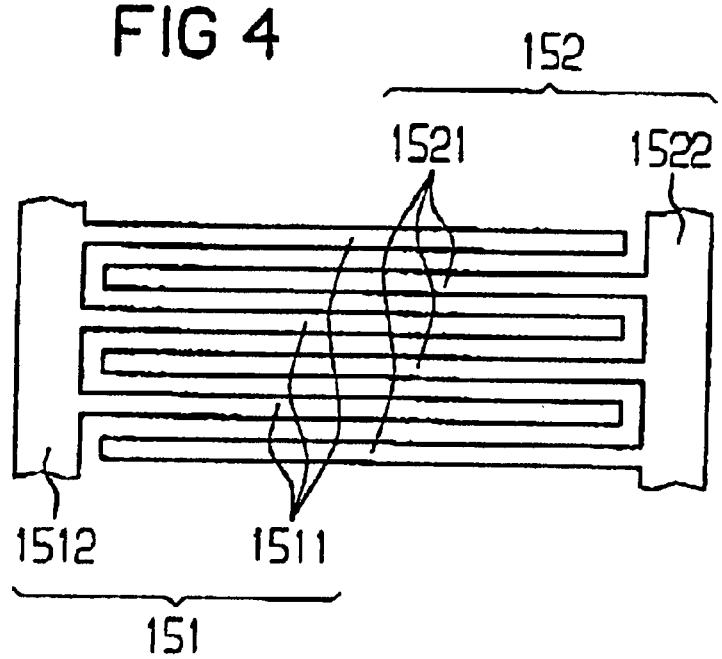
FIG. 4 is a diagrammatic detail of the structure of the first lower electrode and the second lower electrode.

With reference to FIG. 4, the first lower electrode 151 and the second lower electrode 152 in each case have finger-shaped substructures 1511, 1521, which are arranged in an alternating manner, that is to say a finger-shaped substructure 1511 of the first lower electrode 151 and a finger-shaped substructure 1521 of the second lower electrode 152 are respectively arranged alternately. At the edge of the cavity 14, both the first lower electrode 151 and the second lower electrode 152 have in each case a web 1512, 1522, via which the finger-shaped substructures 1511, 1521 are connected to one another. The webs 1512, 1522 of the first lower electrode 151 and of the second lower electrode 152 are arranged on mutually opposite sides of the cavity 14.

The finger-shaped substructures 1511 of the first lower electrode 151 have a spacing of 3 $\mu$m and a rectangular cross section with a width of 1 $\mu$m and a length of 200 $\mu$m. They are arranged parallel to one another. The longitudinal direction of the finger-shaped substructures 1511 is arranged perpendicular to the longitudinal alignment of the web 1512. The dimensions apply correspondingly for the substructures 1521 of the second lower electrode 152. The thickness of the first lower electrode 151 and of the second lower electrode 152 is 0.4 $\mu$m. The piezoelectric layer 16 covers at least the finger-shaped substructures 1511, 1521 of the first lower electrode 151 and of the second lower electrode 152.

Figure 3:
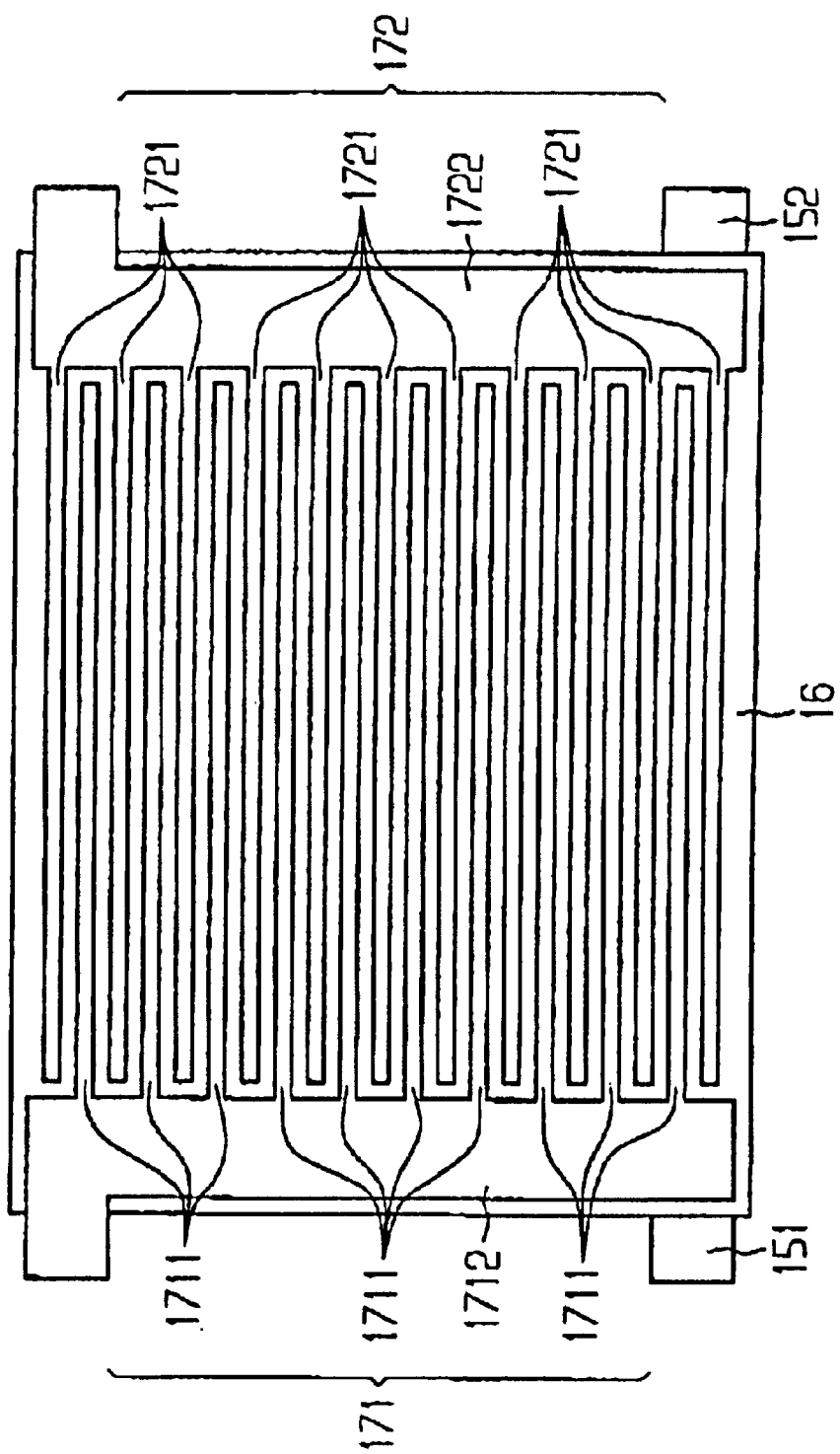
FIG. 3 is a plan view onto the component according to the invention.
Figure 5:
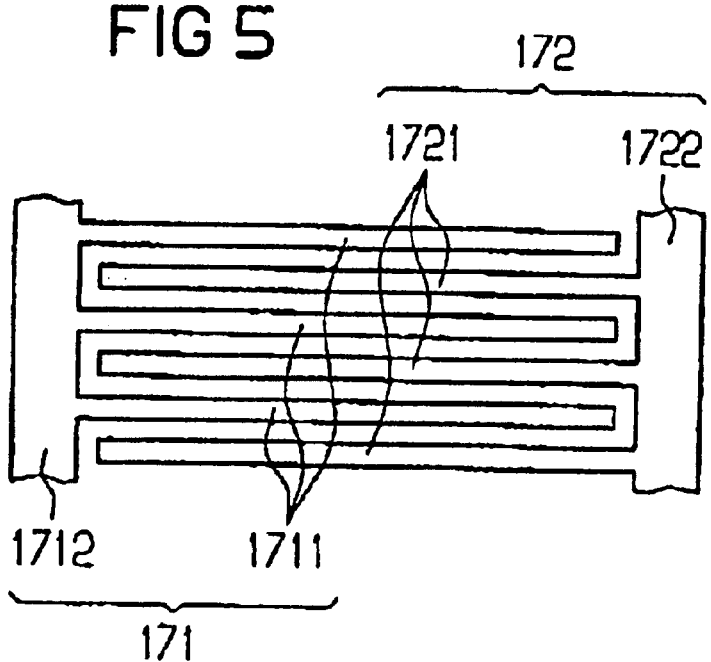
FIG. 5 is a diagrammatic detail of the structure of the first upper electrode and of the second upper electrode.

With reference to FIGS. 3 and 5, the first upper electrode 171 and the second upper electrode 172 are structured in a way analogous to the first lower electrode 151 and the second lower electrode 152. They have in each case finger-shaped substructures 1711, 1721, which are connected to one another via a web 1712, 1722. In the region above the cavity 14, a finger-shaped substructure 1711 of the first upper electrode 171 and a finger-shaped substructure 1721 of the second upper electrode 172 are arranged in an alternating manner (see FIG. 2 and FIG. 3). The webs 1712, 1722 of the first upper electrode 171 and of the second upper electrode 172 are arranged above mutually opposite edges of the cavity 14. The webs 1712, 1722 of the first upper electrode 171 and of the second upper electrode 172 run parallel to the webs 1512, 1522 of the first lower electrode 151 and of the second lower electrode 152 (see FIG. 4 and FIG. 5).

The first upper electrode 171 and the second lower electrode 151 form a first pair of electrodes, the second upper electrode 172 and the second lower electrode 152 form a second pair of electrodes. During the operation of the component, the first pair of electrodes has an input signal applied to it, inducing a mechanical oscillation in the piezoelectric layer. This mechanical oscillation induces an output signal in the second pair of electrodes.

If the input signal is a grounded signal (single-ended signal), the first lower electrode 151 is connected to ground potential and the first upper electrode 171 is connected to the grounded signal. A differential signal (balanced signal), which can be symmetrical with respect to the ground potential, can then be picked off between the second lower electrode 152 and the second upper electrode 172.

Figure 6:
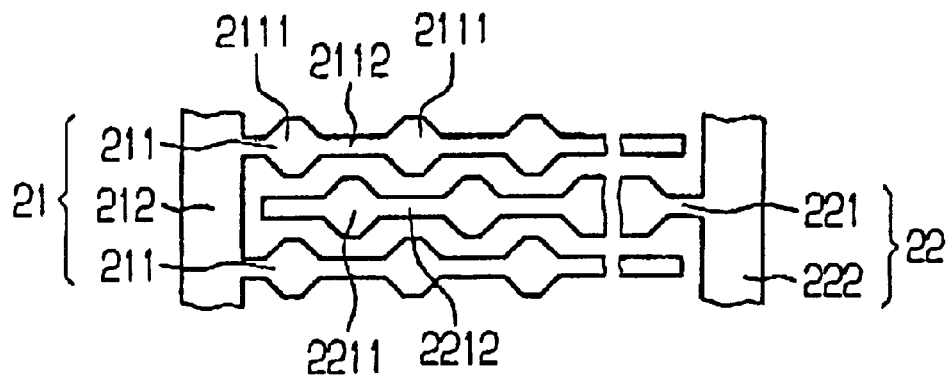
FIG. 6 and FIG. 7 are diagrammatic details of the structure of a first upper electrode and of a second upper electrode and of the associated first lower electrode and second lower electrode, in a further embodiment.
Figure 7:
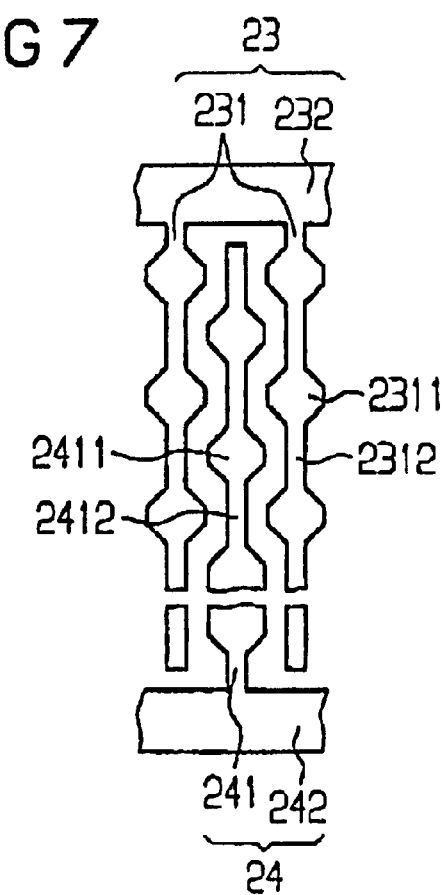

In a further exemplary embodiment—illustrated in FIGS. 6 and 7—a component is provided with a first upper electrode 21, a second upper electrode 22, a first lower electrode 23 and a second lower electrode 24. The construction of the component otherwise corresponds to the construction of the component described with reference to FIG. 1 to FIG. 5. The first upper electrode 21 and the second upper electrode 22 in each case have finger-shaped substructures 211, 221, which are connected to one another via a respective web 212, 222. The first lower electrode 23 and the second lower electrode 24 likewise have finger-shaped substructures 231, 241, which are respectively connected to one another via a web 232, 242.

The finger-shaped substructures 211, 221, 231, 241 of the first upper electrode 21 and of the second upper electrode 22 and also of the first lower electrode 23 and of the second lower electrode 24 in each case have a cross section which contains alternatingly rhombus-shaped parts 2111, 2211, 2311, 2411 and web-shaped parts 2112, 2212, 2312, 2412.

The finger-shaped substructures 211, 221 of the first upper electrode 21 and of the second upper electrode 22 are rotated through 90° with respect to the finger-shaped substructures 231, 241 of the first lower electrode 23 and of the second lower electrode 24, so that the projections of the webs 212, 222 of the first upper electrode 21 and of the second upper electrode 22 intersect the webs 232, 242 of the first lower electrode 23 and of the second lower electrode 24 at 90°. In a corresponding way, the finger-shaped substructures 231, 241 of the first lower electrode 23 and of the second lower electrode 24 are rotated through 90° with respect to the finger-shaped substructures 211, 221 of the first upper electrode 21 and of the second upper electrode 22. The finger-shaped substructures 211 of the first upper electrode 21 and the finger-shaped substructures 231 of the first lower electrode 23 are arranged in relation to one another in such a way that their rhombus-shaped parts 2111, 2311 overlap. In a corresponding way, the finger-shaped substructures 221 of the second upper electrode 22 and the finger-shaped substructures 241 of the second lower electrode 24 are arranged in relation to one another in such a way that their rhombus-shaped parts 2211, 2411 overlap.

Figure 8:
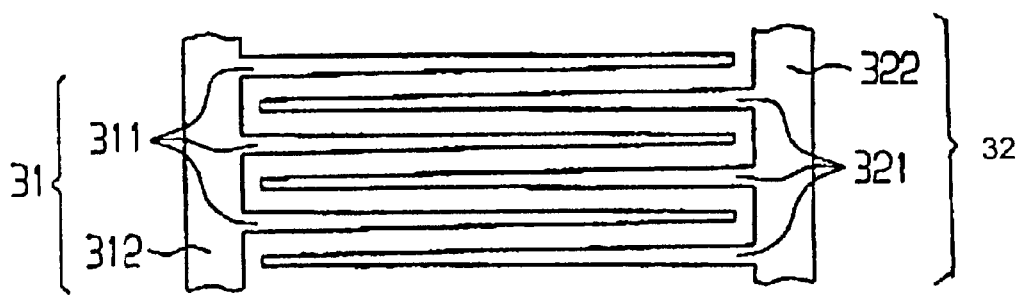
FIG. 8 and FIG. 9 are details of different structurings for the upper or the lower electrodes.

Referring now to FIG. 8, in a further electrode configuration, which is suitable both for lower and upper electrodes, a first electrode 31 and a second electrode 32 in each case have finger-shaped substructures 311, 321, which have a trapezoidal outline. In this case, the dimensions of the individual finger-shaped substructures 311, 321 differ in such a way that these dimensions vary about a mean value. The finger-shaped substructures 311, 321 are respectively connected to one another via a web 312, 322. The trapezoidal cross section of the finger-shaped substructures 311, 321 and their varying dimensions have the effect that lateral modes forming do not cause standing waves. In an arrangement which has trapezoidal finger-shaped substructures in the upper and lower electrodes, these may be both aligned parallel to one another and rotated with respect to one another.

Figure 9:
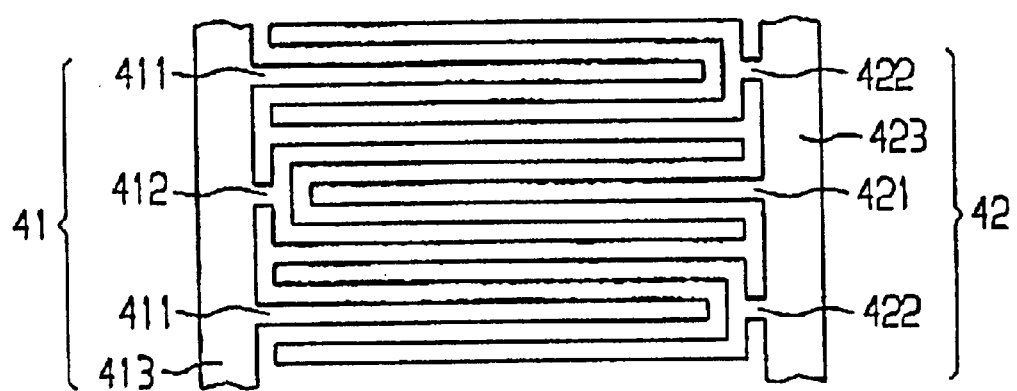

Referring now to FIG. 9, a further electrode configuration, which can be used both for upper electrodes and for lower electrodes as well, has a first electrode 41 and a second electrode 42, which in each case have a rectangular substructure 411, 421 and a U-shaped branched substructure 412, 422 in an alternating manner. The rectangular substructures 411, 421 and the U-shaped branched substructures 412, 422 are in this case connected to one another via a web 413, 423. The U-shaped branched substructures 412, 422 in each case have two legs, which are aligned parallel to the rectangular substructures 411. The rectangular substructures 411 of the first electrode 41 protrude between the legs of the U-shaped branched substructures 422 of the second electrode 42. Conversely, the rectangular substructures 421 of the second electrode 42 protrude between the legs of the U-shaped branched substructures 412 of the first electrode 41. This electrode configuration is suitable both for upper and lower electrodes. It is thereby possible for the substructures in the upper electrodes to be aligned parallel to the substructures in the lower electrodes or rotated with respect to them.

We claim:

1. A component for forming vertically standing waves of a wavelength $\lambda$, comprising:

a piezoelectric layer having a first main surface, a second main surface opposite said first main surface, and a thickness of substantially $\lambda/2$ or an integral multiple of $\lambda/2$;

a first pair of electrodes including a first lower electrode and a first upper electrode, and a second pair of electrodes including a second lower electrode and a second upper electrode;

said first upper electrode and said second upper electrode being formed on said first main surface of said piezoelectric layer, and said first lower electrode and said second lower electrode being formed on said second main surface of said piezoelectric layer;

said first upper electrode, said second upper electrode, said first lower electrode, and said second lower electrode each being structured such that substructures of said first upper electrode and of said second upper electrode engage in one another and substructures of said first lower electrode and of said second lower electrode engage in one another, said substructures having non-constant dimensions varying about a mean value and being configured to suppress formation of lateral wave shape modes.

2. The component according to claim 1, wherein said first lower electrode, said second lower electrode, said first upper electrode and said second upper electrode each are formed with a web and substructures adjacent to and connected to said web;

said first upper electrode and said second upper electrode are disposed such that said substructures of said first upper electrode and said substructures of said second upper electrode are arranged alternatingly; and said first lower electrode and said second lower electrode are disposed such that said substructures of said first lower electrode and said substructures of said second lower electrode are arranged alternatingly.

3. The component according to claim 2, wherein neighboring said substructures are spaced from one another with a spacing distance less than twice a spacing between said first upper electrode and said first lower electrode, and less than twice a spacing between said second upper electrode and said second lower electrode.

4. The component according to claim 3, wherein the spacing distance is loss by at least a factor of 10 than twice the spacing between said first upper electrode and said first lower electrode, and less than twice the spacing between said second upper electrode and said second lower electrode.

5. The component according to claim 2, wherein said substructures are formed as fingers.

6. The component according to claim 2, wherein said substructures are at least partially branched.

7. The component according to claim 2, wherein the spacing of neighboring said substructures is not constant, but varies about a mean value.

8. The component according to claim 2, wherein said substructures have non-constant dimensions that vary about a mean value.

9. The component according to claim 2, wherein said web of said first upper electrode is aligned such that a projection thereof onto said second main surface crosses said web of said first lower electrode; and said web of said second upper electrode is aligned such that a projection thereof onto said second main surface crosses said web of said second lower electrode.

10. The component according to claim 1, wherein said piezoelectric layer is formed with at least one of the materials selected from the group consisting of AlN, ZnO, $PbZrTiO_x$; and a thickness of said piezoelectric layer is between 1 $\mu$m and 3 $\mu$m.

11. The component according to claim 1, wherein said substructures have a cross-section containing alternating web-shaped parts and non-web-shaped parts.

12. The component according to claim 1, wherein said substructures have a trapezoidal cross-section.

* * * * *

UNITED STATES PATENT AND TRADEMARK OFFICE
CERTIFICATE OF CORRECTION

PATENT NO. : 6,734,600 B2
DATED : May 11, 2004
INVENTOR(S) : Robert Aigner et al.

It is certified that error appears in the above-identified patent and that said Letters Patent is hereby corrected as shown below:

<u>Title page,</u>
Item [73], Assignee, should read as follows:
-- Infineon Technologies AG, Munich (DE) and Nokia Mobile Phones Ltd., Espoo (FI) --

Signed and Sealed this

Fourth Day of January, 2005

JON W. DUDAS
*Director of the United States Patent and Trademark Office*

UNITED STATES PATENT AND TRADEMARK OFFICE
CERTIFICATE OF CORRECTION

PATENT NO. : 6,734,600 B2
APPLICATION NO. : 09/968574
DATED : May 11, 2004
INVENTOR(S) : Robert Aigner et al.

It is certified that error appears in the above-identified patent and that said Letters Patent is hereby corrected as shown below:

On The Title Page, Item (56) should read

--FOREIGN PATENT DOCUMENTS

| | | |
|---|---|---|
| DE | 1200890 | 9/1965 |
| DE | 1766036 | 11/1972 |
| DE | 2231467 | 1/1974 |
| JP | 03 096 005 A | 4/1991 |
| JP | 04 018 806 A | 1/1992 |
| JP | 09 130 199 A | 5/1997 |
| FR | 2.191.355 | 2/1974--. |

Signed and Sealed this

Third Day of July, 2007

JON W. DUDAS
*Director of the United States Patent and Trademark Office*